US011145812B2

(12) United States Patent
Molas et al.

(10) Patent No.: US 11,145,812 B2
(45) Date of Patent: Oct. 12, 2021

(54) RESISTIVE RANDOM ACCESS MEMORY DEVICE

(71) Applicant: COMMISSARIAT A L'ENERGIE ATOMIQUE ET AUX ENERGIES ALTERNATIVES, Paris (FR)

(72) Inventors: Gabriel Molas, Grenoble (FR); Philippe Blaise, Grenoble (FR); Faiz Dahmani, La Varenne Saint-Hilaire (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 142 days.

(21) Appl. No.: 15/784,689

(22) Filed: Oct. 16, 2017

(65) Prior Publication Data
US 2018/0040816 A1 Feb. 8, 2018

Related U.S. Application Data

(62) Division of application No. 14/737,593, filed on Jun. 12, 2015, now abandoned.

(30) Foreign Application Priority Data

Jun. 12, 2014 (FR) ...................................... 1455332

(51) Int. Cl.
*H01L 47/00* (2006.01)
*H01L 45/00* (2006.01)
*G11C 13/00* (2006.01)

(52) U.S. Cl.
CPC ........ *H01L 45/122* (2013.01); *G11C 13/0011* (2013.01); *H01L 45/08* (2013.01);
(Continued)

(58) Field of Classification Search
CPC ..... G11C 13/0011; G11C 13/56; H01L 45/08; H01L 45/085; H01L 45/12; H01L 45/122;
(Continued)

(56) References Cited

U.S. PATENT DOCUMENTS

| 8,941,089 B2 | 1/2015 | Gopalan |
| 2007/0120124 A1 | 5/2007 | Chen |

(Continued)

FOREIGN PATENT DOCUMENTS

| FR | 3 003 401 A1 | 9/2014 |
| WO | WO 2014/137485 A1 | 9/2014 |

OTHER PUBLICATIONS

Final Office Action as issued in U.S. Appl. No. 14/736,858, dated Dec. 16, 2016.

(Continued)

*Primary Examiner* — Meiya Li
(74) *Attorney, Agent, or Firm* — Pillsbury Winthrop Shaw Pittman LLP (57) ABSTRACT

A resistive random access memory device includes a first electrode; a solid electrolyte made of metal oxide extending onto the first electrode; a second electrode able to supply mobile ions circulating in the solid electrolyte made of metal oxide to the first electrode to form a conductive filament between the first and second electrodes when a voltage is applied between the first and second electrodes; an interface layer including a transition metal from groups 3, 4, 5 or 6 of the periodic table and a chalcogen element; the interface layer extending onto the solid electrolyte made of metal oxide, the second electrode extending onto the interface layer.

8 Claims, 5 Drawing Sheets

(52) U.S. Cl.
CPC ............ *H01L 45/085* (2013.01); *H01L 45/12* (2013.01); *H01L 45/1233* (2013.01); *H01L 45/1266* (2013.01); *H01L 45/14* (2013.01); *H01L 45/146* (2013.01); *H01L 45/16* (2013.01); *H01L 45/1608* (2013.01); *G11C 2213/56* (2013.01)

(58) Field of Classification Search
CPC . H01L 45/1233; H01L 45/1266; H01L 45/14; H01L 45/146; H01L 45/16; H01L 45/1608
See application file for complete search history.

(56) References Cited

U.S. PATENT DOCUMENTS

| | | |
|---|---|---|
| 2008/0061341 A1 | 3/2008 | Lung |
| 2011/0140065 A1 | 6/2011 | Maesaka |
| 2013/0001497 A1* | 1/2013 | Ohba ................... H01L 45/085 257/2 |
| 2013/0082228 A1 | 4/2013 | Parrillo |
| 2013/0082232 A1 | 4/2013 | Wu |
| 2013/0089949 A1 | 4/2013 | Phatak et al. |
| 2014/0103284 A1 | 4/2014 | Hsueh |

OTHER PUBLICATIONS

Preliminary Search Report as issued in French Patent Application No. 1455332, dated Feb. 13, 2015.
Lin, Y. Y., et al., A Novel Retention-Enhanced Structure and a Reset Transient Model for Energy-Efficient Electrochemical Conducting Bridge Resistive Memory Nanoelectronics Conference (INEC), IEEE 4$^{th}$ International, Jun. 2011, pp. 1-2.
Non-Final Office Action as issued in U.S. Appl. No. 14/736,858, dated Apr. 12, 2016.
Chen, Y. S., et al., "Well controlled multiple resistive switching states in the Al local doped HfO2 resistive random access memory device," Journal of Applied Physics, vol. 113, No. 16, Apr. 2013, pp. 164507-1-164507-6.
Liu, L. F., et al., "Unipolar resistive switching and mechanism in Gd-doped-TiO2-based resistive switching memory devices," Semiconductor Science and Technology, vol. 26, No. 11, Oct. 2011, 6 pages.
Zhao, L., et al., "Dopant Selection Rules for Extrinsic Tunability of HfOx RRAM Characteristics: A Systematic Study," 2013 Symposium on VLSI Technology Digest of Technical Papers, Jun. 2013, 2 pages.
Chen, Y. Y., et al., "Tailoring switching and endurance / retention reliability characteristics of HfO2 / Hf RRAM with Ti, Al, Si dopants," 2014 Symposium on VLSI Technology Digest of Technical Papers, Jun. 2014, 2 pages.

\* cited by examiner

"OFF" state  "ON" state

RESISTIVE RANDOM ACCESS MEMORY DEVICE

CROSS-REFERENCE TO RELATED APPLICATIONS

This application is a divisional of U.S. patent application Ser. No. 14/737,593, filed Jun. 12, 2015, which claims priority to French Patent Application No. 1455332, filed Jun. 12, 2014, the entire contents of which are incorporated herein by reference in their entirety.

FIELD

The present invention relates to the field of rewritable non-volatile memories, and more specifically to that of resistive random access memories. A resistive random access memory comprises first and second electrodes separated by a layer made of electrically insulating material, and passes from an insulating state to a conducting state by formation of a conductive filament between the first and second electrodes.

BACKGROUND

Resistive Random Access Memories (RRAM) are today the subject of great interest, particularly on account of their low electrical consumption and their high operating speed.

A resistive type memory cell has at least two states: a "High Resistance State" (HRS), also called "OFF" state, and a "Low Resistance State" (LRS) or "ON" state. It may thus be used to store binary information.

Three types of resistive memories may be distinguished: memories based on thermochemical mechanism, memories based on valence change, and memories based on electrochemical metallisation.

The field of the present invention more particularly relates to this latter category based on ion conduction materials (CBRAM or "Conductive Bridging RAM" memories). The operation resides in the reversible formation and rupture of a conductive filament in a solid electrolyte, through dissolution of a soluble electrode. These memories are promising due to their low programming voltages (of the order of a Volt), their short programming times (<1 µs), their low consumption and their low integration cost. Furthermore, these memories can be integrated into the metallisation levels of the logic of a circuit ("above IC"), which makes it possible to increase the integration density of the circuit. From the architectural viewpoint, they only require a selection device, a transistor or a diode for example.

The operation of CBRAM memories is based on the formation, within a solid electrolyte, of one or more metal filaments (also called "dendrites") between two electrodes, when the electrodes are taken to suitable potentials. The formation of the filament makes it possible to obtain a given electrical conduction between the two electrodes. By modifying the potentials applied to the electrodes, it is possible to modify the distribution of the filament, and thus to modify the electrical conduction between the two electrodes. For example, by reversing the potential between the electrodes, it is possible to make disappear or reduce the metal filament, so as to eliminate or reduce considerably the electrical conduction due to the presence of the filament.

Figure 1:
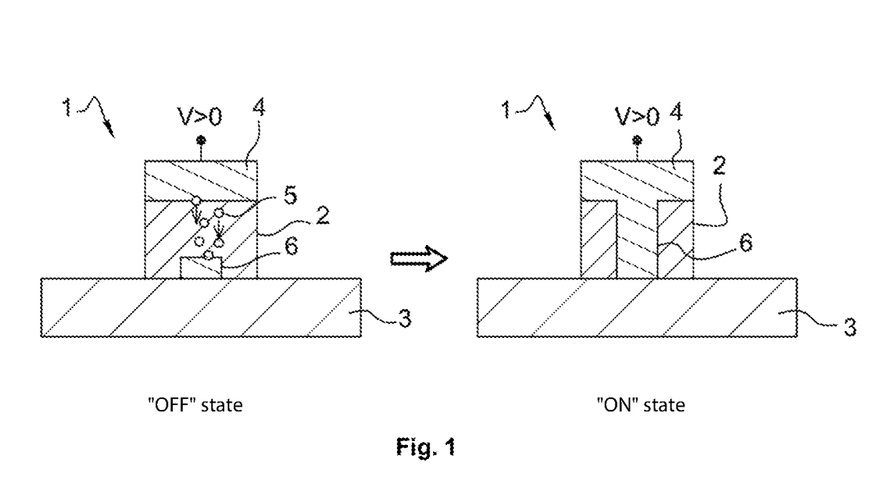
FIG. 1 shows a schematic representation of the passage from an "OFF" state to an "ON" state for a CBRAM type memory device.

FIG. 1 schematically illustrates the passage from on "OFF" state to an "ON" state for a CBRAM type memory device 1.

This device 1 is formed by a Metal/Ion conductor/Metal type stack. It comprises a solid electrolyte 2, for example based on doped chalcogenide (e.g. GeS) or oxide (e.g. $Al_2O_3$). The electrolyte 2 is arranged between a lower electrode 3, for example made of Pt, forming an inert cathode, and an upper electrode 4 comprising a portion of ionisable metal, for example copper, and forming an anode. A portion of ionisable metal is a portion of metal able to form metal ions (here $Cu^{2+}$ ions) when it is subjected to a suitable electrical potential. The device 1 represented in FIG. 1 typically forms a memory point, that is to say a unit memory cell, of a memory comprising a multitude of these memory devices.

As indicated previously, the memory state of a CBRAM memory device results from the difference in electrical resistivity between two states: "ON" and "OFF".

In the "OFF" state, the metal ions (here $Cu^{2+}$ ions for a soluble electrode comprising Cu) coming from the portion of ionisable metal are dispersed throughout the solid electrolyte 2. Thus, no electrical contact is established between the cathode 3 and the anode 4, that is to say between the upper electrode and the lower electrode. The solid electrolyte comprises an electrically insulating zone of high resistivity between the anode and the cathode.

When a positive potential V is applied to the upper soluble electrode 4 (the anode), an oxidation-reduction reaction takes place at the electrode, creating mobile ions 5. In the case of a copper electrode 4, the following reaction takes place:

$$Cu \rightarrow Cu^{2+} + 2e^-.$$

The ions 5 then move in the electrolyte 2 under the effect of the electrical field applied to the electrodes. The speed of movement depends on the mobility of the ion in the electrolyte in question, which guides the choice of the soluble electrode/electrolyte pairing (examples: Ag/GeS; $Cu/Al_2O_3$, etc.). The speeds of movement of the ions are of the order of nm/ns.

On arrival at the inert electrode 3 (the cathode), the ions 5 are reduced due to the presence of electrons supplied by the electrode 3, leading to the growth of a metal filament 6 according to the following reaction:

$$Cu^{2+} + 2e^- \rightarrow Cu$$

The filament 6 grows preferentially in the direction of the soluble electrode 4.

The memory 1 then passes to the "ON" state when the filament 6 enables contact between the electrodes 3 and 4, making the stack conductive. This phase is called "SET" of the memory.

To pass to the "OFF" state ("RESET" phase of the memory), a negative voltage V is applied to the upper electrode 4, leading to the dissolution of the conductive filament. To justify this dissolution, thermal (heating) and oxidation-reduction mechanisms are generally put forward.

Often, the electrolyte 2 contains in the "OFF" state a residual filament 6 in contact with the cathode 3. This stems from the preceding SET phase and has not been dissolved completely during the RESET of the memory. The filament is designated residual when it does not establish a sufficient electrical conduction between the electrodes to obtain the "ON" state.

An area of development for CBRAM memories relates to the retention of information, that is to say the retention of the "OFF" state and the "ON" state. It is sought to improve the stability of the insulating and conducting states, particularly for high operating temperatures. Numerous studies relate to these CBRAM memories in order to improve their electrical performances. One of the difficulties of CBRAM memories in fact relates to the difficulty of forming the filament in the electrolyte.

SUMMARY

An aspect of the invention is thus to propose a metal oxide based CBRAM memory cell having improved retention of information. Another aspect of the invention is to propose a metal oxide based CBRAM memory cell having improved electrical performances.

An aspect of the invention thus relates to a resistive random access memory device comprising:
  a first electrode, designated "inert electrode";
  a solid electrolyte made of metal oxide extending at least partially onto the first electrode;
  a second electrode, designated "soluble electrode", the first and second electrodes being respectively arranged on either side of the solid electrolyte made of metal oxide, the second electrode being able to supply mobile ions circulating in the solid electrolyte made of metal oxide to the first electrode to form a conductive filament between the first and second electrodes when a voltage is applied between the first and second electrodes;
the device comprising an interface layer including:
  a transition metal from groups 3, 4, 5 or 6 of the periodic table;
  a chalcogen element;
the interface layer extending at least partially onto the solid electrolyte made of metal oxide, the second electrode extending at least partially onto the interface layer.

"Chalcogen element" is taken to mean an element of group 16 of the periodic table. The interface layer beneficially makes it possible to contribute to the creation of a plurality of oxygen vacancies at the interface with the solid electrolyte made of metal oxide. This plurality of oxygen vacancies makes it possible to facilitate the movement of mobile ions, and thus the formation of the conductive filament. This thus contributes to reducing the forming voltage, that is to say the voltage to apply between the soluble electrode and the inert electrode to enable the formation of the conductive filament during the forming step. The interface layer also beneficially makes it possible to contribute to improving the retention of information, that is to say to the increase of the persistence of the conductive filament within the metal oxide based solid electrolyte, when no voltage is applied. The interface layer is in fact able to behave like a barrier for the mobile ions forming the conductive filament, thereby avoiding any dissolution of the filament.

Apart from the characteristics that have been evoked in the previous paragraph, the resistive random access memory device according to an aspect of the invention may have one or more additional characteristics among the following, considered individually or according to any technically possible combinations thereof:
  The transition metal from groups 3, 4, 5 or 6 of the periodic table is titanium Ti. In fact, titanium oxide (III, IV) has a very high enthalpy of formation thereby enabling the titanium to take up oxygen in the solid electrolyte made of metal oxide, that is to say in the memory layer, and thus to generate oxygen vacancies in the solid electrolyte made of metal oxide.
  Alternatively, the transition metal is hafnium Hf, zirconium Zr, scandium Sc, vanadium V, chromium Cr, yttrium Y, niobium Nb or tantalum Ta.
  The chalcogen element is tellurium Te. In fact, tellurium Te has a mobility and an aptitude to segregate which contribute to favouring a separation of phases within the interface layer.
  Alternatively, the chalcogen element is sulphur S or selenium Se.
  In an embodiment, the second electrode comprises:
    a first layer, designated "ion source layer", made from a soluble conductive element and extending at least partially onto the interface layer;
    a second layer, designated "diffusion barrier", made from a conductive material and extending at least partially onto the ion source layer;
    a third layer, designated "electrical contact layer", made from a conductive material and extending at least partially onto the diffusion barrier;
  the diffusion barrier being able to limit at least partially the diffusion of the conductive material of the electrical contact layer to the ion source layer over a given temperature range.
    In the present description, "soluble conductive element" or "soluble conductive material" are taken to mean an element or a material able to participate in the formation of a conductive filament within the solid electrolyte made of metal oxide, that is to say an element or a conductive material able to release mobile ions for the formation of the conductive filament within the solid electrolyte made of metal oxide. The diffusion barrier of the second electrode contributes to controlling efficiently the concentration of the transition metal from groups 3, 4, 5 or 6 of the periodic table within the interface layer. The diffusion barrier may be made of titanium nitride TiN, tantalum nitride TaN, ruthenium Ru or ruthenium nitride RuN.
  The interface layer comprises a soluble conductive element. The soluble conductive element is, in an embodiment, copper Cu or zinc Zn or silver Ag, or any binary or tertiary alloy of copper Cu and/or zinc Zn and/or silver Ag. In this latter case, the soluble conductive element may particularly be copper nitride $Cu_3N$ or zinc nitride $Zn_3N_2$ or silver nitride $Ag_3N$.
  In the case where the resistive random access memory device according to an aspect of the invention includes an ion source layer and an interface layer comprising a soluble conductive element, the interface layer and the ion source layer comprises the same soluble conductive element.
  Alternatively, in the case where the resistive random access memory device according to an aspect of the invention includes an ion source layer and an interface layer comprising a soluble conductive element, the soluble conductive element of the ion source layer could be distinct from the soluble conductive element of the interface layer.

Another aspect of the invention relates to a first method of manufacturing a resistive random access memory device according to an aspect of the invention, comprising the following steps:
  a) forming the first electrode;
  b) forming, on the first electrode, the solid electrolyte made of metal oxide;
  c) forming, on the solid electrolyte made of metal oxide, the interface layer;

d) forming, on the interface layer, the second electrode.

Apart from the steps cited in the preceding paragraph, the method of manufacturing a resistive random access memory device according to the first embodiment of the invention may have one or more additional steps among the following, considered individually or according to all technically possible combinations thereof:

According to a first alternative, step c) comprises the following sub-steps:
  depositing, on the solid electrolyte made of metal oxide, a layer comprising the chalcogen element;
  depositing, on the layer comprising the chalcogen element, a layer comprising the transition metal from groups 3, 4, 5 or 6 of the periodic table;
  thermal annealing for the at least partial diffusion of the transition metal into the layer comprising the chalcogen element, and for obtaining the interface layer;
and step d) comprises the following sub-step:
  depositing, on the interface layer, an ion source layer comprising a soluble conductive element.

According to a second alternative, step c) comprises the following sub-steps:
  depositing, on the solid electrolyte made of metal oxide, a layer comprising the transition metal from groups 3, 4, 5 or 6 of the periodic table, the chalcogen element and a soluble conductive element;
  thermal annealing for the separation of the layer comprising the transition metal, the chalcogen element and the soluble conductive element into:
    the interface layer of formula $P_x N_y T_{1-(x+y)}$, P being the soluble conductive element, N the chalcogen element and T the transition metal, with $x \leq 10\%$ and $y \leq 55\%$, the interface layer extending to the contact of the solid electrolyte made of metal oxide;
    an ion source layer, extending to the contact of the interface layer and comprising the soluble conductive element.

According to a third alternative, step c) comprises the following sub-steps:
  depositing, on the solid electrolyte made of metal oxide, a layer comprising the chalcogen element and the soluble conductive element;
  depositing, on the layer comprising the chalcogen element and the soluble conductive element, a layer comprising the transition metal from groups 3, 4, 5 or 6 of the periodic table;
  thermal annealing for the at least partial diffusion of the transition metal into the layer comprising the chalcogen element and the soluble conductive element, and for obtaining the interface layer;
and step d) comprises the following sub-step:
  depositing, on the interface layer, an ion source layer comprising the soluble conductive element.

According to a fourth alternative, step c) comprises the following sub-steps:
  depositing, on the solid electrolyte made of metal oxide, a layer comprising the transition metal from groups 3, 4, 5 or 6 of the periodic table and the chalcogen element;
  depositing, on the layer comprising the transition metal and the chalcogen element, a layer comprising the soluble conductive element;
  thermal annealing for the at least partial diffusion of the soluble conductive element into the layer comprising the transition metal and the chalcogen element, and for obtaining the interface layer;
and step d) comprises the following sub-step:
  depositing, on the interface layer, an ion source layer comprising the soluble conductive element.

According to any one of the first, second, third or fourth alternatives, step d) comprises the following sub-steps:
  depositing, on the ion source layer comprising the soluble conductive element, a diffusion barrier made from a conductive material;
  depositing, on the diffusion barrier, an electrical contact layer made from a conductive material;
  the ion source layer, the diffusion barrier and the electrical contact layer forming the second electrode, the diffusion barrier being able to limit at least partially the diffusion of the conductive material of the electrical contact layer to the ion source layer over a given temperature range.

Embodiments of the invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION

Unless stated otherwise, a same element appearing in the different figures has a single reference.

In the present description, the expressions "CBRAM memory cell", "CBRAM type memory device" and "resistive random access memory device" will be employed indiscriminately.

FIG. 1, which shows a schematic representation of the passage from an "OFF" state to an "ON" state for a CBRAM type memory device, has been described previously.

Figure 2:
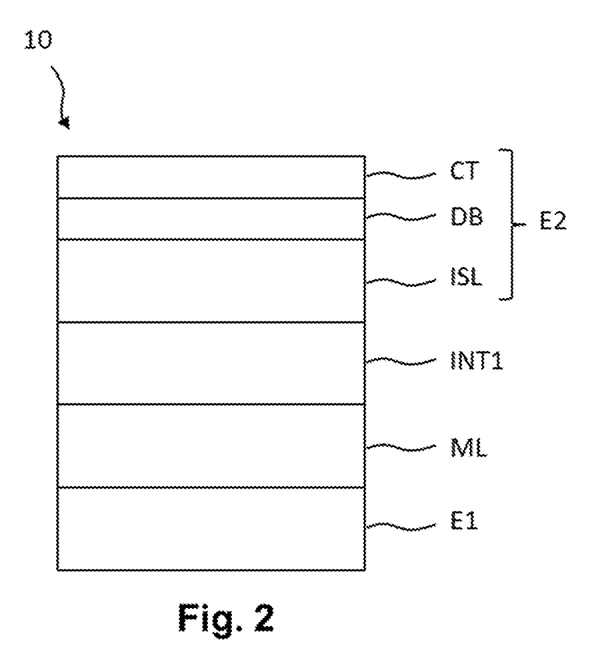
FIG. 2 schematically illustrates a metal oxide based CBRAM memory cell according to an aspect of the invention.

FIG. 2 schematically illustrates a metal oxide based CBRAM memory cell 10 according to a first embodiment of the invention. The CBRAM memory cell 10 according to the first embodiment of the invention comprises:
  a first electrode E1, also called "inert electrode" or "cathode", extending along a reference plane;
  a solid electrolyte ML made of metal oxide, extending onto the first electrode E1, parallel to the reference plane;

an interface layer INT1 of a first type extending onto the solid electrolyte ML made of metal oxide, parallel to the reference plane;

a second electrode E2, also called "soluble electrode" or "anode", extending onto the interface layer INT, parallel to the reference plane.

The second electrode E2 includes:

a first layer ISL, designated "ion source layer" made from a soluble conductive element and extending onto the interface layer INT1 of the first type;

a second layer DB, designated "diffusion barrier", made from a conductive material and extending onto the ion source layer ISL;

a third layer CT, designated "electrical contact layer", made from a conductive material and extending at least partially onto the diffusion barrier DB.

The first electrode E1 is made of an inert conductive material, that is to say not participating in the formation of a conductive filament within the solid electrolyte ML made of metal oxide. This inert conductive material may typically be:

ruthenium Ru,
ruthenium dioxide $RuO_2$,
tungsten W,
tungsten nitride $WN_x$,
tantalum nitride TaN,
titanium nitride TiN, or any alloy or combination of the elements which have just been cited.

In the particular example represented in FIG. 2, the solid electrolyte ML made of metal oxide is made of gadolinium oxide $Gd_2O_3$. In particular, the solid electrolyte ML made of metal oxide may be made of hybrid gadolinium oxide $Gd_2O_3$, that is to say comprising at least one first sub-layer made of gadolinium oxide $Gd_2O_3$ and one second sub-layer made of gadolinium oxide $Gd_2O_3$. The first sub-layer is a standard sub-layer formed by RF sputtering using an argon Ar, xenon Xe or krypton Kr gas. The second sub-layer is formed by RF sputtering using, in addition to a main gas of argon Ar, xenon Xe or krypton Kr, oxygen as second gas such that the oxygen/main gas ratio is less than or equal to 1/16. The first and second sub-layers are, at least partially, directly in contact with each other, and the first and second sub-layers are typically substantially of the same thickness.

Alternatively, the following configurations, considered individually or according to all technically possible combinations thereof, could be adopted:

the solid electrolyte ML made of metal oxide is made of aluminium oxide $Al_2O_3$, zirconium dioxide $ZrO_2$, titanium dioxide $TiO_2$ or tantalum oxide $Ta_2O_5$;

the solid electrolyte ML made of metal oxide comprises at least one bilayer of type $Gd_2O_3/Al_2O_3$, $Gd_2O_3/GeO$, $Gd_2O_3/La_2O_3$, $Gd_2O_3/Li_2O$, $Gd_2O_3/B_2O_3$, $Gd_2O_3/WO_2$, $Gd_2O_3/VO_2$, $Gd_2O_3/V_2O_5$, $Gd_2O_3/MgO$ or $Gd_2O_3/MgAl_2O_4$;

the solid electrolyte ML made of metal oxide comprises at least one trilayer of type $Gd_2O_3/Al_2O_3/Gd_2O_3$, $Gd_2O_3/GeO/Gd_2O_3$, $Gd_2O_3/La_2O_3/Gd_2O_3$, $Gd_2O_3/Li_2O/Gd_2O_3$, $Gd_2O_3/B_2O_3/Gd_2O_3$, $Gd_2O_3/WO_2/Gd_2O_3$, $Gd_2O_3/VO_2/Gd_2O_3$, $Gd_2O_3/V_2O_5/Gd_2O_3$, $Gd_2O_3/MgO/Gd_2O_3$, $Gd_2O_3/MgAl_2O_4/Gd_2O_3$.

The ion source layer ISL of the second electrode E2 is made of soluble conductive material, that is to say participating in the formation of a conductive filament within the solid electrolyte ML made of metal oxide. The soluble conductive material may be for example:

copper Cu;
zinc Zn;
silver Ag;
copper nitride $Cu_3N$;
zinc nitride $Zn_3N_2$;
silver nitride $Ag_3N$.

The diffusion barrier DB of the second electrode E2 is made of a conductive material, such as for example:

titanium nitride TiN;
tantalum nitride TaN;
ruthenium Ru or ruthenium nitride RuN.

The diffusion barrier DB is typically a thin layer, of thickness less than or equal to 5 nm. The thickness of the diffusion barrier DB is measured along a direction substantially perpendicular to the reference plane.

It will be appreciated that the diffusion barrier DB makes it possible to contribute to an efficient control of the concentration of the transition metal in the interface layer INT.

The electrical contact layer CT of the second electrode E2 is made from a conductive material, such as for example Ti—TiN, that is to say a layer of Ti and a layer of TiN, or Ta—TaN, that is to say a layer of Ta and a layer of TaN.

According to the first embodiment of the invention, the interface layer INT1 of the first type comprises:

a transition metal from groups 3, 4, 5 or 6 of the periodic table, referred to hereafter as "transition metal", and
a chalcogen element.

In an embodiment, the transition metal is titanium Ti, or alternatively hafnium Hf or zirconium Zr. In an embodiment, the chalcogen element is tellurium Te, or alternatively sulphur S or selenium Se.

The interface layer INT1 of the first type according to the first embodiment of the invention is also designated by the acronym ICL (Ion Crossing Layer).

Figure 5A:
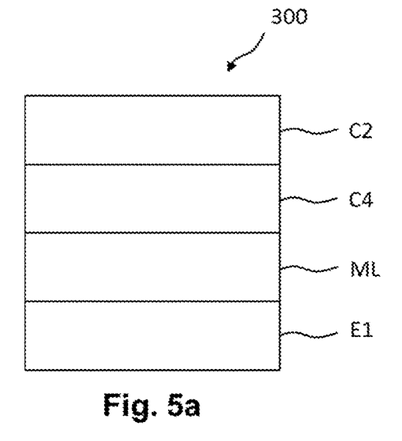
FIGS. 5a, 5b, 5c and 5d show the steps of a first method of manufacturing a metal oxide based CBRAM memory cell according to a second embodiment of the invention.
Figure 5D:
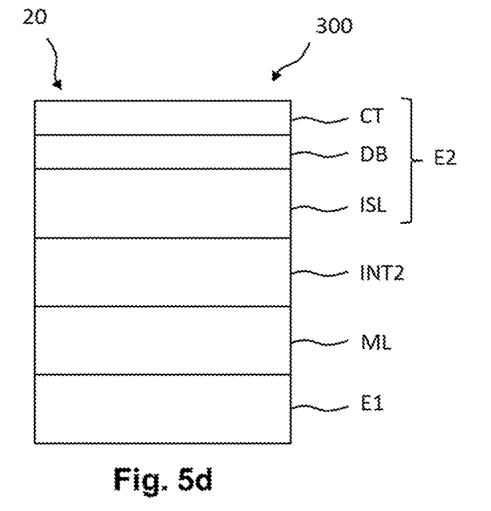
Figure 6A:
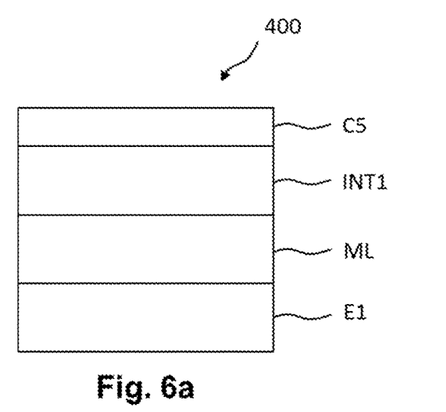
FIGS. 6a, 6b, 6c and 6d show the steps of a second method of manufacturing a metal oxide based CBRAM memory cell according to the second embodiment of the invention.

According to a second embodiment of the invention, the CBRAM memory cell (reference 20 of FIGS. 5d and 6d) includes an interface layer INT2 of a second type, comprising:

a transition metal as described previously,
a chalcogen element, and
a soluble conductive element.

The interface layer INT2 of the second type is particularly represented in FIGS. 5d and 6d, which are described hereafter.

In the same way as previously:

the transition metal of the interface layer INT2 of the second type is titanium Ti, or alternatively hafnium Hf or zirconium Zr, and
the chalcogen element of the interface layer INT2 of the second type is tellurium Te, or alternatively sulphur S or selenium Se.

The soluble conductive element of the interface layer INT2 of the second type is beneficially the same as the soluble conductive element of the ion source layer ISL. Thus, for example, when the ion source layer ISL is made from copper Cu, the soluble conductive element of the interface layer INT2 of the second type is copper Cu. The interface layer INT2 of the second type is also designated by the acronym IBL (Ion Buffer Layer). The choice of the soluble conductive material of the ion source layer ISL thus determines the soluble conductive element present in the interface layer INT2 of the second type.

FIGS. 3a to 3d schematically illustrate the steps of a first method 100 of manufacturing a metal oxide based CBRAM memory cell 10 according to the first embodiment of the invention, in which the CBRAM memory cell 10 comprises the interface layer of the first type INT1.

Figure 3A:
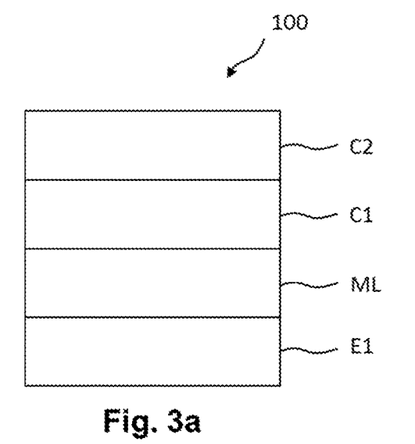
FIGS. 3a, 3b, 3c and 3d show the steps of a first method of manufacturing a metal oxide based CBRAM memory cell according to a first embodiment of the invention.

The method 100 of manufacturing a metal oxide based CBRAM memory cell 10 according to the first embodiment firstly comprises the following steps:
- forming the first electrode E1;
- forming, on the first electrode E1, the solid electrolyte made of metal oxide ML;
- depositing, on the solid electrolyte made of metal oxide ML, a C1 layer comprising the chalcogen element;
- depositing, on the C1 layer comprising the chalcogen element, a C2 layer comprising the transition metal.

FIG. 3a schematically shows the result obtained at the end of the steps which have just been cited. In the particular example of FIG. 3a, the transition metal of the C2 layer is titanium Ti, the solid electrolyte made of metal oxide ML is made of gadolinium oxide and the chalcogen element of the C1 layer is tellurium Te.

Figure 3B:
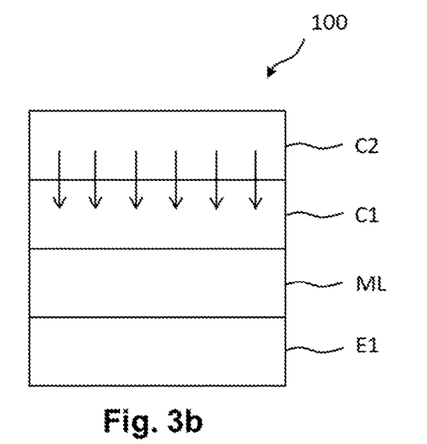

The first method 100 of manufacturing a metal oxide based CBRAM memory cell 10 according to the first embodiment then comprises a thermal annealing step, illustrated in FIG. 3b. This thermal annealing step is carried out typically at a temperature comprised between 100° C. and 450° C., and for a duration comprised between 1 minute and 20 minutes.

Figure 3C:
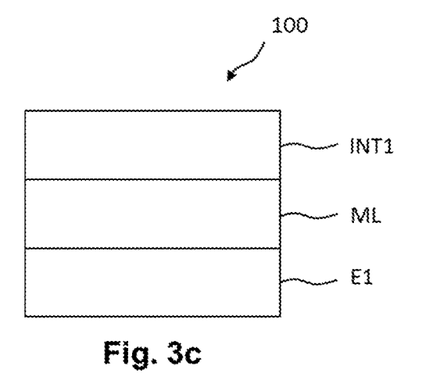

The thermal annealing step enables the at least partial diffusion of the transition metal of the C2 layer, deposited previously, into the C1 layer comprising the chalcogen element. At the end of the thermal annealing step, the diffusion of the transition metal into the C1 layer makes it possible to obtain the interface layer of the first type INT1, comprising the transition metal and the chalcogen element. FIG. 3c schematically illustrates the stack thereby obtained at the end of the thermal annealing step.

According to a first alternative, the first method 100 of manufacturing a metal oxide based CBRAM memory cell 10 according to the first embodiment may comprise, in addition to the thermal annealing step that has just been described, a UV irradiation step. This UV irradiation step is then carried out typically with an average power comprised between 20 $mW/cm^2$ and 150 $mW/cm^2$, for a duration comprised between 1 minute and 20 minutes, and for wavelengths comprised between 100 nm and 400 nm.

It will be appreciated that the UV irradiation step makes it possible to break bonds in the solid electrolyte made of metal oxide, and thus to generate defects capable of promoting oxygen vacancies in the solid electrolyte made of metal oxide.

According to this first alternative, the steps of thermal annealing and UV irradiation may then take place simultaneously or not. Thus, generally speaking:
- the thermal annealing step could indiscriminately start before, at the same time as or after the start of the UV irradiation step, and
- the thermal annealing step could indiscriminately end before, at the same time as or after the end of the UV irradiation step.

Figure 3D:
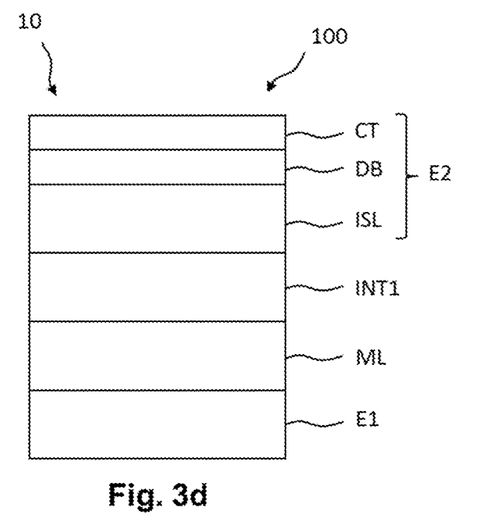

The first method 100 of manufacturing a metal oxide based CBRAM memory cell 10 according to the first embodiment finally comprises the following steps:
- depositing, on the interface layer of the first type INT1, the ion source layer ISL comprising the soluble conductive element;
- depositing, on the ion source layer ISL, the diffusion barrier DB;
- depositing, on the diffusion barrier DB, the electrical contact layer CT.

The ion source layer ISL, the diffusion barrier DB and the electrical contact layer CT form the second electrode E2.

FIG. 3d schematically illustrates the metal oxide based CBRAM memory cell 10 according to the first embodiment of the invention, obtained by the manufacturing method 100; this cell 10 is identical to that illustrated in FIG. 2.

FIGS. 4a to 4d schematically illustrate the steps of a second method 200 of manufacturing a metal oxide based CBRAM memory cell 10 according to the first embodiment of the invention, in which the CBRAM memory cell 10 comprises the interface layer of the first type INT1.

Figure 4A:
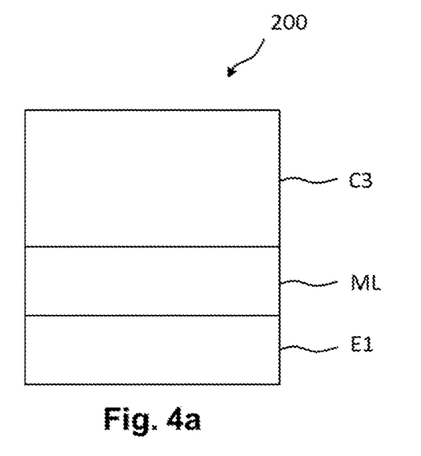
FIGS. 4a, 4b, 4c and 4d show the steps of a second method of manufacturing a metal oxide based CBRAM memory cell according to the first embodiment of the invention.

The second method 200 of manufacturing a metal oxide based CBRAM memory cell 10 according to the first embodiment firstly comprises, in the same way as the first method 100, the following steps:
- forming the first electrode E1;
- forming, on the first electrode E1, the solid electrolyte made of metal oxide ML.

The second method 200 then comprises a step of depositing, on the solid electrolyte made of metal oxide ML, a C3 layer comprising the transition metal, the chalcogen element and a soluble conductive element. The soluble conductive element of the C3 layer is able to participate in the formation of a conductive filament within the solid electrolyte made of metal oxide ML and may thus for example be:
- copper Cu;
- zinc Zn;
- silver Ag;
- copper nitride $Cu_3N$;
- zinc nitride $Zn_3N_2$;
- silver nitride $Ag_3N$.

FIG. 4a schematically shows the result obtained at the end of the steps that have just been cited. In the particular example of FIG. 4a, the C3 layer comprises titanium Ti, tellurium Te and copper Cu.

Figure 4B:
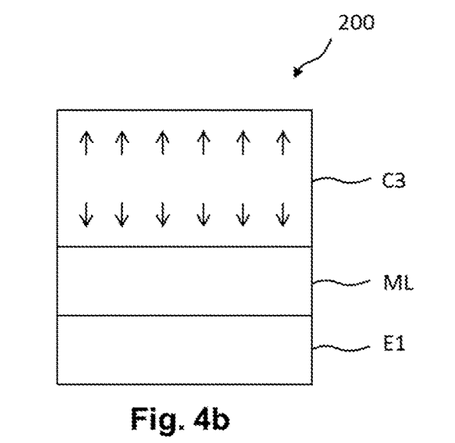

The second method 200 of manufacturing a metal oxide based CBRAM memory cell 10 according to the first embodiment then comprises, in the same way as the first method 100, a thermal annealing step, illustrated in FIG. 4b. This thermal annealing step is carried out typically at a temperature comprised between 100° C. and 450° C., and for a duration comprised between 1 minute and 20 minutes.

Figure 4C:
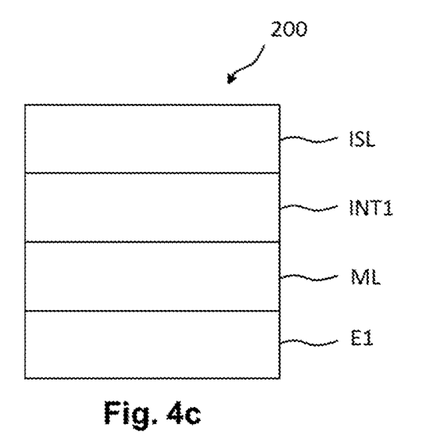

The thermal annealing step enables the at least partial separation of the species of the C3 layer and to obtain:
- the interface layer of the first type INT1, extending to the contact of the solid electrolyte made of metal oxide ML and comprising the transition metal and the chalcogen element, and
- the ion source layer ISL, extending to the contact of the interface layer of the first type INT1 and comprising the soluble conductive element.

FIG. 4c schematically illustrates the stack thereby obtained at the end of the thermal annealing step.

According to a first alternative, the second method 200 of manufacturing a metal oxide based CBRAM memory cell 10 according to the first embodiment may comprise, in addition to the thermal annealing step that has just been described, a UV irradiation step. This first alternative has been described previously in the case of the first method 100. The UV irradiation step makes it possible to break the bonds in the solid electrolyte made of metal oxide, and thus to generate defects capable of promoting oxygen vacancies in the solid electrolyte made of metal oxide.

Figure 4D:
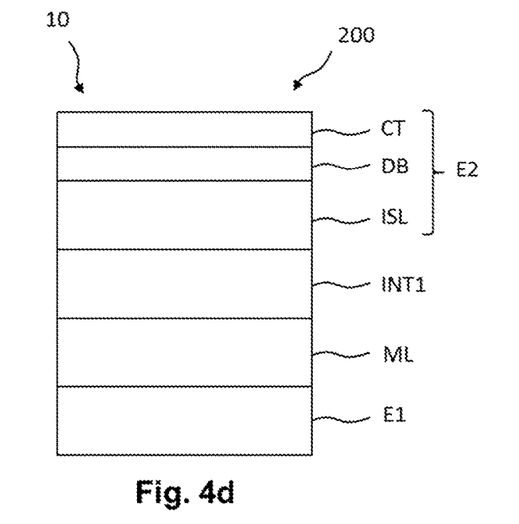

The second method 200 of manufacturing a metal oxide based CBRAM memory cell 10 according to the first embodiment finally comprises the following steps:
- depositing, on the ion source layer ISL, the diffusion barrier DB;

depositing, on the diffusion barrier DB, the electrical contact layer CT.

The ion source layer ISL, the diffusion barrier DB and the electrical contact layer CT form the second electrode E2.

FIG. 4d schematically illustrates the metal oxide based CBRAM memory cell 10 according to the first embodiment of the invention, obtained by the manufacturing method 200. This cell 10 is identical to that illustrated in FIG. 2.

FIGS. 5a to 5d schematically show the steps of a first method 300 of manufacturing a metal oxide based CBRAM memory cell according to the second embodiment of the invention, in which the CBRAM memory cell 20 comprises the interface layer of the second type INT2. The first method 300 of manufacturing the metal oxide based CBRAM memory cell 20 according to the second embodiment firstly comprises the following steps:

forming the first electrode E1;
forming, on the first electrode E1, the solid electrolyte made of metal oxide ML;
depositing, on the solid electrolyte made of metal oxide ML, a C4 layer comprising the chalcogen element and a soluble conductive element;
depositing, on the C4 layer comprising the chalcogen element and the soluble conductive element, a C2 layer comprising the transition metal.

The choice of the soluble conductive element of the C4 layer is determined by the type of soluble conductive material that it is wished to use later to form the ion source layer ISL. For example, in the case where it is wished to form later an ion source layer ISL made of copper Cu, the soluble conductive element of the C4 layer is copper Cu.

FIG. 5a schematically shows the result obtained at the end of the steps that have just been cited. In the particular example of FIG. 5a, the solid electrolyte made of metal oxide ML is made of gadolinium oxide and the C4 layer comprises tellurium Te and copper Cu.

Figure 5B:
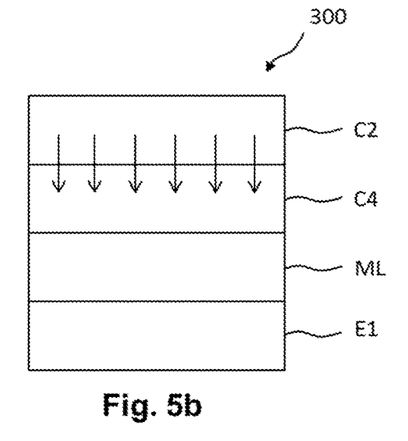

The first method 300 of manufacturing the metal oxide based CBRAM memory cell 20 according to the second embodiment then comprises a thermal annealing step, illustrated in FIG. 5b. This thermal annealing step is carried out typically at a temperature comprised between 100° C. and 450° C., and for a duration comprised between 1 minute and 20 minutes.

Figure 5C:
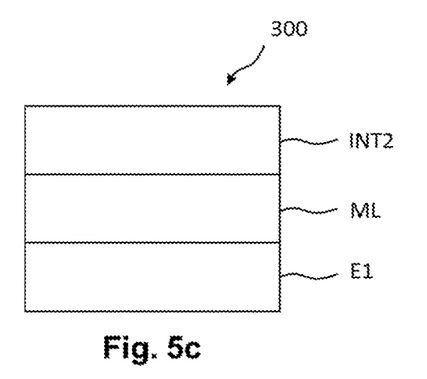

The thermal annealing step enables the at least partial diffusion of the transition metal of the C2 layer, deposited previously, into the C4 layer comprising the chalcogen element and the soluble conductive element. At the end of the thermal annealing step, the diffusion of the transition metal into the C4 layer makes it possible to obtain the interface layer of the second type INT2, comprising the transition metal, the chalcogen element and the soluble conductive element. FIG. 5c schematically illustrates the stack thereby obtained at the end of the thermal annealing step.

According to a first alternative, the first method 300 of manufacturing the metal oxide based CBRAM memory cell 20 according to the second embodiment may comprise, in addition to the thermal annealing step that has just been described, a UV irradiation step. This first alternative has been described previously in the case of the first method 100 of manufacturing the metal oxide based CBRAM memory cell 10 according to the first embodiment of the invention. The UV irradiation step makes it possible to break bonds in the solid electrolyte made of metal oxide, and thus to generate defects capable of promoting oxygen vacancies in the solid electrolyte made of metal oxide.

The first method 300 of manufacturing the metal oxide based CBRAM memory cell 20 according to the second embodiment finally comprises the following steps:

depositing, on the interface layer of the second type INT2, the ion source layer ISL, the ion source layer ISL comprising a soluble conductive element;
depositing, on the ion source layer ISL, the diffusion barrier DB;
depositing, on the diffusion barrier DB, the electrical contact layer CT.

The ion source layer ISL, the diffusion barrier DB and the electrical contact layer CT form the second electrode E2.

As evoked above, FIG. 5d schematically illustrates a metal oxide based CBRAM memory cell 20 according to the second embodiment of the invention, obtained by the manufacturing method 300.

FIGS. 6a to 6d schematically show the steps of a second method 400 of manufacturing the metal oxide based CBRAM memory cell 20 according to the second embodiment of the invention (as represented in FIGS. 5d and 6d), in which the CBRAM memory cell 20 comprises the interface layer of the second type INT2.

The second method 400 of manufacturing the metal oxide based CBRAM memory cell 20 according to the second embodiment firstly comprises the following steps:

forming the first electrode E1;
forming, on the first electrode E1, the solid electrolyte made of metal oxide ML;
depositing, on the solid electrolyte made of metal oxide ML, the interface layer of the first type INT1 comprising the transition metal and the chalcogen element;
depositing, on the interface layer of the first type INT1, a C5 layer of a soluble conductive element.

The soluble conductive element of the C5 layer is typically determined by the type of soluble conductive material that it is wished to use later to form the ion source layer ISL. In the case where it is wished to form later an ion source layer ISL made of copper Cu, the soluble conductive element of the C3 layer is copper Cu. FIG. 6a schematically shows the result obtained at the end of the steps which have just been cited.

Figure 6B:
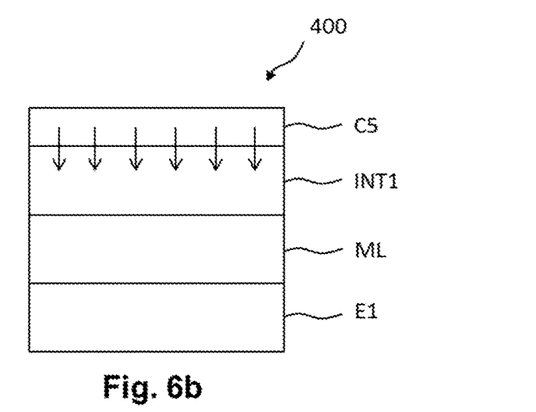

The second method 400 of manufacturing the metal oxide based CBRAM memory cell 20 according to the second embodiment then comprises a thermal annealing step, illustrated in FIG. 6b. This thermal annealing step is carried out typically at a temperature comprised between 100° C. and 450° C., and for a duration comprised between 1 minute and 20 minutes.

According to a first alternative, the second method 400 of manufacturing the metal oxide based CBRAM memory cell 20 according to the second embodiment may comprise, instead of the thermal annealing step that has just been described, a UV irradiation step. According to a second alternative, the second method 400 may comprise the thermal annealing step and the UV irradiation step. These first and second alternatives have been described previously in the case of the first method 100 of manufacturing the metal oxide based CBRAM memory cell 10 according to the first embodiment of the invention.

Figure 6C:
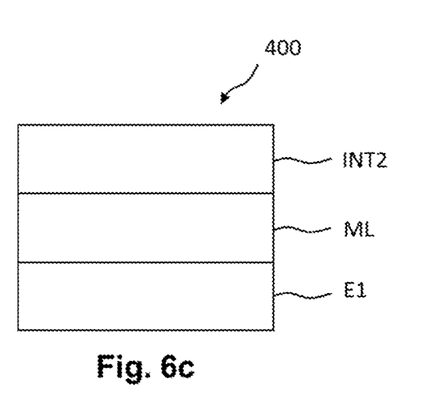
Figure 6D:
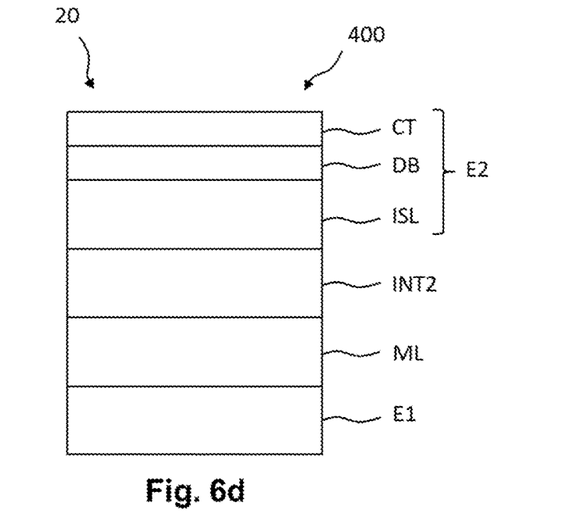

The thermal annealing step and/or the UV irradiation step enable the at least partial diffusion of the soluble conductive element of the C5 layer, deposited previously, into the interface layer of the first type INT1. At the end of the thermal annealing step and/or the UV irradiation step, the diffusion of the soluble conductive element into the interface layer of the first type INT1 makes it possible to obtain the interface layer of the second type INT2, comprising the transition metal, the chalcogen element and the soluble conductive element. FIG. 6c schematically illustrates the stack thereby obtained at the end of the thermal annealing step and/or the UV irradiation step.

The second method 400 of manufacturing the CBRAM memory cell 20 according to the second embodiment finally comprises the following steps:

depositing, on the interface layer of the second type INT2, the ion source layer ISL, the ion source layer ISL comprising the soluble conductive element;

depositing, on the ion source layer ISL, the diffusion barrier DB;

depositing, on the diffusion barrier DB, the electrical contact layer CT.

The ion source layer ISL, the diffusion barrier DB and the electrical contact layer CT form the second electrode E2.

FIG. 6d schematically illustrates the metal oxide based CBRAM memory cell 20 (identical to the cell 20 of FIG. 5d) according to the second embodiment of the invention, obtained by the manufacturing method 400.

The invention claimed is:

1. A method of manufacturing a resistive random access memory device, the method comprising:
   forming a first electrode;
   forming, on the first electrode, a solid electrolyte made of metal oxide extending at least partially onto the first electrode;
   forming, on the solid electrolyte made of metal oxide, an interface layer;
   forming, on the interface layer, a soluble second electrode, the soluble second electrode being configured to supply mobile ions circulating in the solid electrolyte made of metal oxide to the first electrode to form a conductive filament between the first electrode and the soluble second electrode when a voltage is applied between the first electrode and the soluble second electrode,
   wherein said forming, on the solid electrolyte made of metal oxide, of the interface layer comprises the following sub-steps:
   (i) a first sub-step of depositing, on the solid electrolyte made of metal oxide, a layer comprising a chalcogen element and a soluble conductive element;
   (ii) after the first sub-step, a second sub-step of depositing, on the layer comprising the chalcogen element and the soluble conductive element, a layer comprising a transition metal from groups 3, 4, 5 or 6 of the periodic table; and
   (iii) after the second sub-step, a third sub-step of thermal annealing for at least partially diffusing the transition metal into the layer comprising the chalcogen element and the soluble conductive element, and for obtaining the interface layer; and
   wherein said forming, on the interface layer, of the soluble second electrode comprises depositing, on the interface layer, an ion source layer comprising the soluble conductive element, said depositing, on the interface layer, of the ion source layer being carried out after said third sub-step of thermal annealing.

2. The method according to claim 1, wherein forming the soluble second electrode comprises:
   depositing, on the ion source layer comprising the soluble conductive element, a diffusion barrier made from a conductive material;
   depositing, on the diffusion barrier, an electrical contact layer made from a conductive material;
   the ion source layer, the diffusion barrier and the electrical contact layer forming the soluble second electrode, the diffusion barrier being configured to limit at least partially the diffusion of the conductive material of the electrical contact layer to the ion source layer over a given temperature range.

3. The method according to claim 1, wherein the transition metal is from groups 3, 4, 5 or 6 of the periodic table is titanium (Ti).

4. The method according to claim 1, wherein the chalcogen element is tellurium (Te).

5. The method according to claim 1, wherein the layer comprising the transition metal from groups 3, 4, 5 or 6 of the periodic table is deposited in contact with the layer comprising the chalcogen element and the soluble conductive element.

6. The method according to claim 1, wherein the layer comprising the chalcogen element and the soluble conductive element is a single layer.

7. The method according to claim 1, wherein the layer comprising the chalcogen element and the soluble conductive element and the layer comprising the transition metal from groups 3, 4, 5 or 6 of the periodic table are the only two layers deposited for forming the interface layer before performing the thermal annealing.

8. The method according to claim 1, wherein the layer comprising the chalcogen element and the soluble conductive element is the only layer deposited between the solid electrolyte made of metal oxide and the layer comprising the transition metal from groups 3, 4, 5 or 6 of the periodic table.

* * * * *